United States Patent
Namuduri et al.

(10) Patent No.: US 10,665,398 B1
(45) Date of Patent: May 26, 2020

(54) DIRECT CURRENT SOLID-STATE SWITCH

(71) Applicant: GM GLOBAL TECHNOLOGY OPERATIONS LLC, Detroit, MI (US)

(72) Inventors: Chandra S. Namuduri, Troy, MI (US); Rashmi Prasad, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 0 days.

(21) Appl. No.: 16/579,103

(22) Filed: Sep. 23, 2019

(51) Int. Cl.

| | |
|---|---|
| *H01H 9/02* | (2006.01) |
| *H01H 9/54* | (2006.01) |
| *H02J 1/00* | (2006.01) |
| *H01H 9/52* | (2006.01) |
| *H02J 1/08* | (2006.01) |

(52) U.S. Cl.
CPC .......... *H01H 9/0271* (2013.01); *H01H 9/52* (2013.01); *H01H 9/542* (2013.01); *H02J 1/00* (2013.01); *H01H 2009/544* (2013.01); *H02J 1/082* (2020.01)

(58) Field of Classification Search
CPC combination set(s) only.
See application file for complete search history.

(56) References Cited

U.S. PATENT DOCUMENTS

| | | | |
|---|---|---|---|
| 2014/0042564 A1* | 2/2014 | Tsai | H01H 13/88 257/415 |
| 2016/0374229 A1* | 12/2016 | Nishikimi | H02M 7/003 |
| 2019/0334340 A1* | 10/2019 | Niehoff | H01H 9/541 |

* cited by examiner

*Primary Examiner* — Daniel J Cavallari
(74) *Attorney, Agent, or Firm* — Quinn IP Law

(57) ABSTRACT

A switch assembly includes a case and a direct current (DC) electronic solid-state switch coupled to the case. The case covers the DC electronic solid-state switch, and the DC electronic solid-state switch has an on-state and off-state. The DC electronic solid-state switch blocks between 650 volts and 1200 volts in a single direction in an off-state. The DC electronic solid-state switch continuously carries at least 400 amperes direct current with a voltage drop of less than one volt. The DC electronic solid-state switch also includes a plurality of semiconductor dies each forming a MOSFET. The DC electronic solid-state switch also includes a plurality of signal conductors.

20 Claims, 6 Drawing Sheets

DIRECT CURRENT SOLID-STATE SWITCH

INTRODUCTION

The present disclosure relates to electrical components, and more specifically, direct current (DC) electronic solid-state switches and assemblies.

Existing High Voltage, high current electromechanical relays are bulky (i.e., with a mass greater than 0.5 kg), have slow switching speeds (i.e., switching speed greater than 10 ms) and are prone to contact welding during high current switching due to contact bounce. Further, existing, electromechanical relays produce customer annoying audible noise during switching. Therefore, there is a need to develop a switch that is lightweight, has fast switching speeds, and is quiet.

SUMMARY

The present disclosure relates to DC electronic solid-state switches. The presently disclosed switch assembly is lightweight, has fast switching speed, and is quiet. Further, the presently disclosed DC electronic solid-state switches achieves the following desirable benefits, namely: continuously carries at least 400 amperes direct current with a voltage drop of less than one volt; has 50% less power loss than IGBTs; is scalable; has fast fault interruptability; has fault current limiting, has increased repeatability and reliability; has no arc to contain or extinguish; has intelligent power control; and a custom package.

In an aspect of the present disclosure, the switch assembly includes a case and a direct current (DC) electronic solid-state switch coupled to the case. The case covers the DC electronic solid-state switch, and the DC electronic solid-state switch has an on-state and off-state. The DC electronic solid-state switch may include a base plate, an electrically insulating and thermally conductive layer disposed on the base plate, and a first electrically conductive trace disposed on the electrically insulating and thermally conductive layer. The first electrically conductive trace forms a positive terminal. The DC electronic solid-state switch further includes a second electrically conductive trace disposed on the electrically insulating and thermally conductive layer. The second electrically conductive trace forms a negative terminal. The DC electronic solid-state switch also includes a plurality of semiconductor dies each disposed on the first electrically conductive trace. Each of the plurality of semiconductor dies forms a MOSFET or an IGBT or other type of electronically controllable switch that can be fabricated by standard semiconductor processing methods. The DC electronic solid-state switch further includes a first plurality of electrical bonds each electrically connected to a respective one of the plurality of semiconductor dies. Each of the first plurality of electrical bonds electrically interconnects the plurality of semiconductor dies and the second electrically conductive trace. The DC electronic solid-state switch also includes a plurality of signal conductors disposed on the electrically insulating and thermally conductive layer and a second plurality of electrical bonds that are electrically connecting the plurality of signal conductors to the plurality of semiconductor dies. The DC electronic solid-state switch blocks between 650 volts and 1200 volts in a single direction in an off-state, and the DC electronic solid-state switch continuously carries at least 400 amperes direct current with a voltage drop of less than one volt in an on-state.

The base plate may have a thickness between two millimeters and three millimeters, and the plurality of semiconductor dies may be electrically connected to one another in parallel. The switch assembly may further include a solder layer disposed between the base plate and the electrically insulating and thermally conductive layer to connect the base plate to the electrically insulating and thermally conductive layer. The case may include a polymeric material. The electrically insulating and thermally conductive layer may include a ceramic material. The base plate may include copper, aluminum, molybdenum, or alloys thereof, or metal matrix composites such as AlSiC. The solder layer may be directly coupled to the base plate. Each of the base plate, the electrically insulating and thermally conductive layer, and the solder layer may have a planar shape.

Each of the first electrically conductive trace and the second electrically conductive trace may be directly coupled to the electrically insulating and thermally conductive layer. Each of the first electrically conductive trace and the second electrically conductive trace may be directly bonded to the electrically insulating and thermally conductive layer. Each of the plurality of signal conductors may be directly coupled to the electrically insulating and thermally conductive layer. Each of the plurality of signal conductors may be directly bonded to the electrically insulating and thermally conductive layer. Each of the plurality of signal conductors, the first electrically conductive trace, and the second electrically conductive trace may include a metallic material, such as copper or aluminum and alloys thereof.

Each of the plurality of semiconductor dies may have a minimum area of twenty square millimeters. Each of the plurality of semiconductor dies may include a semiconductor material. The semiconductor material may be silicon, silicon carbide, and gallium nitride. The plurality of semiconductor dies may include between four and sixteen semiconductor dies connected in parallel to carry a 400A current. Each of the plurality of first electrical bonds may be a ribbon bond or a wire bond. Each of the second plurality of electrical bonds may be a wire bond.

Each of the first electrically conductive trace and the second electrically conductive trace may be directly coupled to the electrically insulating and thermally conductive layer. The switch assembly may include between four and sixteen semiconductors dies, and a specific on-resistance of each of the semiconductor dies may be less than 3.5 to 4.5 mΩ-cm$^2$. The switch assembly may have a maximum width of 55 to 65 millimeters, a maximum length of 65 millimeters, and a maximum height of 25 millimeters. The switch assembly may further include a plurality of thermistors coupled to the signal conductors. The isolation resistance of the switch assembly may be greater than 50 megaohms. The DC electronic solid-state switch may have a mass that is equal to or less than 250 grams and a switching on/off times is less than 10 microseconds.

The switch assembly may further include a metallic sheet, wherein the electrically insulating and thermally conductive layer is directly bonded on the metallic sheet. The metallic sheet and the electrically insulating and thermally conductive layer may collectively form direct bonded substrate. The metallic sheet includes a metal, such as copper and aluminum.

The DC electronic solid-state switch may be capable carrying a scalable current continuously in the on-state with a low on-state resistance, and the semiconductor dies are capable of blocking at least between 650V and 1200V direct current. The spacing between adjacent semiconductor dies may be greater than one millimeter and less than three millimeters. The switch assembly may further include a heat sink directly coupled to the base plate. The heat sink may include a heat-sink plate and a plurality of pin fins protruding from the heat-sink plate. The base plate has a maximum thickness between two millimeters and three millimeters.

The switch assembly may further include a thermal interface material disposed between the heat-sink plate and the base plate. The maximum thickness of the thermal interface material may be 0.1 millimeters. The maximum thickness of the base plate may be 2 millimeters.

The switch assembly may further include a metallic sheet. The electrically insulating and thermally conductive layer may be directly bonded on the metallic sheet. The maximum thickness of metallic sheet may be 0.3 millimeters. The maximum thickness of the electrically insulating and thermally conductive layer may be between 0.1 millimeters and 0.4 millimeters. The maximum thickness of each of the first electrically conductive trace and the second electrically conductive trace may be between 0.3 millimeters and 0.8 millimeters. The maximum thickness of each of the semiconductor dies may be 0.2 millimeters.

The above features and advantages, and other features and advantages, of the present teachings are readily apparent from the following detailed description of some of the best modes and other embodiments for carrying out the present teachings, as defined in the appended claims, when taken in connection with the accompanying drawings.

DETAILED DESCRIPTION

The following detailed description is merely exemplary in nature and is not intended to limit the application and uses. Furthermore, there is no intention to be bound by expressed or implied theory presented in the preceding introduction, summary or the following detailed description.

Embodiments of the present disclosure may be described herein in terms of functional and/or logical block components and various processing steps. It should be appreciated that such block components may be realized by a number of hardware, software, and/or firmware components configured to perform the specified functions. For example, an embodiment of the present disclosure may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that embodiments of the present disclosure may be practiced in conjunction with a number of systems, and that the systems described herein are merely exemplary embodiments of the present disclosure.

For the sake of brevity, techniques related to signal processing, data fusion, signaling, control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that alternative or additional functional relationships or physical connections may be present in an embodiment of the present disclosure.

Figure 1:
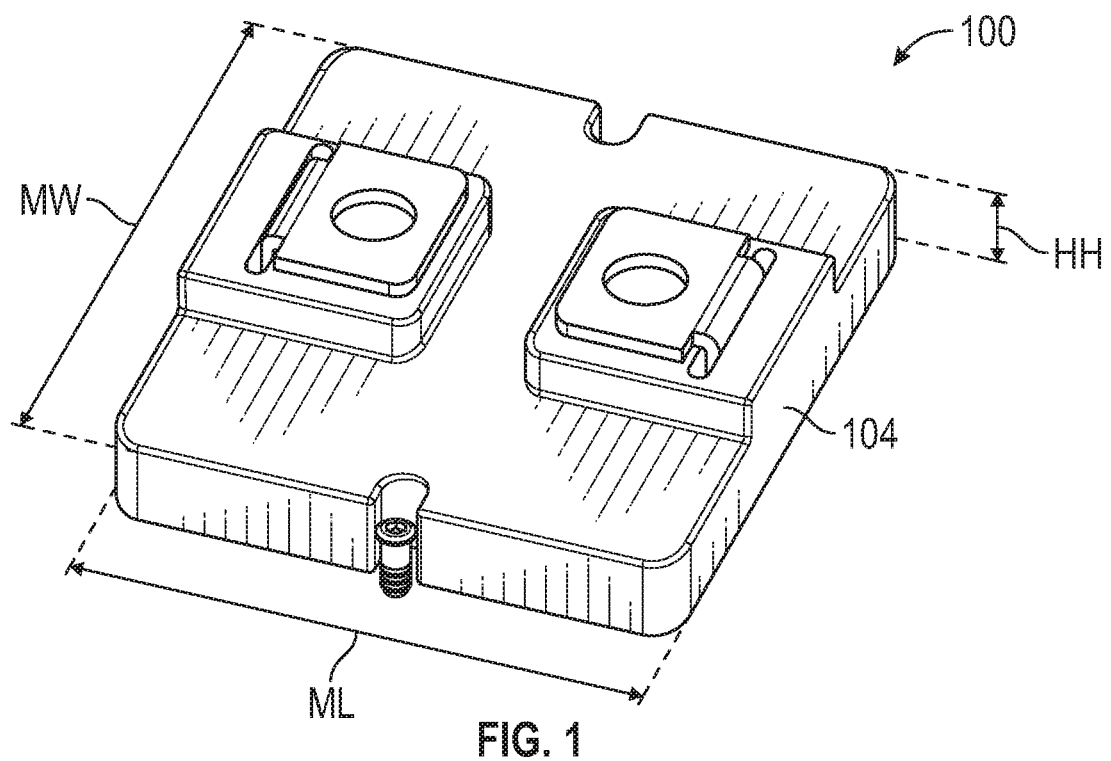
FIG. 1 is a schematic perspective view of a switch assembly.

With reference to FIG. 1, a switch assembly 100 includes a DC electronic solid-state switch 102 having an off-state and an on-state. Due to its configuration as described below, the DC electric solid-state switch 102 is capable of blocking at least 900 volts in a single direction SD during the off-state. Due to its configuration as described below, the DC electronic solid-state switch continuously carries at least 400 amperes direct current during the on-state with a voltage drop of less than 1 volts. Due to its configuration as described below, the DC electronic solid-state switch 102 has a mass that is equal to or less than 250 grams and the switching on/off times is less than 10 microseconds. Due to its configuration as described below, the switch assembly 100 has a maximum width MW of 55 to 65 millimeters, a maximum length ML of 65 millimeters, and a maximum height HH of 25 millimeters, thereby minimizing the size of the switch assembly 100. Due to the configuration described, an isolation resistance of the switch assembly is greater than 50 megaohms (Me).

The switch assembly 100 includes a case 104 that covers the DC electronic solid-state switch 102. The case 104 is also configured to retain and encapsulate the hardware of the DC electronic solid-state switch 102 and may be wholly or partly made of an electrically insulating and rigid material, such as a rigid polymeric material. Due to the its configuration below, the mass of the switch assembly 100 does not exceed 250 grams.

With reference to FIGS. 2-6, the DC electronic solid-state switch 102 includes a base plate 106 having mounting holes 108 on opposite sides of the base plate 106. The base plate 106 has a maximum thickness BT between two millimeters and three millimeters to minimize the overall size of the DC electronic solid-state switch 102. Further, the base plate 106 has an essentially planar shape (and therefore flat configuration) to minimize the overall size of the DC electronic solid-state switch 102. In addition, the base plate 106 may be wholly or partly made of a thermally conductive material, such as a metal or metal matrix composite. For example, the base plate 106 may be wholly or partly made of copper, aluminum, molybdenum or alloys thereof or metal matrix composites such as AlSiC or copper foam, and may be mounted to a heat sink. The base plate 106 may optimally have pin fins.

The DC electronic solid-state switch 102 includes an electrically insulating and thermally conductive layer 110 disposed on (although not directly on) the base plate 106. The electrically insulating and thermally conductive layer 110 may be wholly or made of a ceramic material. Suitable ceramic materials for the electrically insulating and thermally conductive layer 110 include, but are not limited to, aluminum oxide ($Al_2O_3$), Aluminum Nitride (AlN), Aluminum Silicon Carbide (AlSiC), Silicon Nitride ($Si_3N_4$), Diamond, Gallium Oxide among others.

The DC electronic solid-state switch 102 includes a solder layer 112 disposed between the base plate 106 and the electrically insulating and thermally conductive layer 110 to connect the base plate 106 to the electrically insulating and thermally conductive layer 110. The term "solder" means a low-melting alloy, especially one based on lead and tin or (for higher temperatures) on brass or silver, used for joining less fusible metals. The solder layer 112 is directly disposed on the base plate 106 to facilitate and enhance the connection between the solder layer112 and the base plate 106. Each of the base plate 106, the electrically insulating and thermally conductive layer 110, and the solder layer 112 has a planar shape to minimize the size coupled by the DC electronic solid-state switch 102.

The DC electronic solid-state switch 102 further includes a metallic sheet 114 directly coupled to the electrically insulating and thermally conductive layer 110 to form a direct bonded substrate 1. The direct bonded substrate 115 has a thickness that is between 0.1 millimeter to 0.8 millimeters to minimize the size of the DC electronic solid-state switch 102. The metallic sheet 114 may be directly bonded to the electrically insulating and thermally conductive layer to form a direct bonded substrate. The metallic sheet 114 may be wholly or partly made of copper and, and therefore form a direct bonded copper (DBC) substrates in conjunction with the electrically insulating and thermally conductive layer 110. The metallic sheet 114 may be wholly or partly made of an aluminum to form a direct bonded aluminum (DBA) substrate in conjunction of the electrically insulating and thermally conductive layer 110. The metallic sheet 114 may be directly coupled (and directly disposed on) the solder layer 112 to enhance the structural integrity of the DC electronic solid-state switch 102. As such, the metallic sheet 114 is disposed between the solder layer 112 and the electrically insulating and thermally conductive layer 110 (e.g., ceramic layer). In other words, the metallic sheet 114 is sandwiched between the solder layer 112 and the electrically insulating and thermally conductive layer 110.

The DC electronic solid-state switch 102 further includes a first electrically conductive trace 116 directly disposed on the electrically insulating and thermally conductive layer 110 to minimize the size occupied by the DC electronic solid-state switch 102. The first electrically conductive trace 116 is directly disposed on (and directly bonded to) the electrically insulating and thermally conductive layer 110 to enhance the structural integrity of the DC electronic solid-state switch 102. The first electrically conductive trace 116 has a planar shape to minimize its size and forms a positive terminal. Further, the first electrically conductive trace 116 is wholly or partly made of a metallic material, such as copper or aluminum.

The DC electronic solid-state switch 102 further includes a second electrically conductive trace 118 directly disposed on the electrically insulating and thermally conductive layer 110 to minimize the space occupied by the DC electronic solid-state switch 102. For instance, the second electrically conductive trace 118 is directly disposed on (and directly bonded to) the electrically insulating and thermally conductive layer 110. The second electrically conductive trace 118 has a planar shape to minimize its size and forms a negative terminal. Further, the electrically conductive trace 118 is made of a metallic material, such as copper or aluminum.

The DC electronic solid-state switch 102 further includes a plurality of signal conductors 120 (e.g., a first signal conductor 120a and a second signal conductor 120b) directly disposed on the electrically insulating and thermally conductive layer 110. The first electrically conductive trace 116 is substantially U-shaped and partially surrounds the signal conductors 120. In the present disclosure, the term "substantially U-shaped" means a shape including two parallel legs directly connected to another leg that is perpendicular to the two parallel legs. The second electrically conductive trace 118 is also substantially U-shaped and partially surrounds first electrically conductive trace 116. The substantially U-shape of the first electrically conductive trace 116 and the second electrically conductive trace 118 helps minimize the size of the DC electronic solid-state switch 102. The first signal conductor 120a and the second signal conductor 120b are wholly or partly made of a metallic material, such as copper or aluminum, and are directly bonded to the electrically insulating and thermally conductive layer 110 (e.g., ceramic layer). The first signal conductor 120a may be refer to as the source conductor (S), and the second signal conductor 120b may be referred to as the gate conductor. The control inputs carried through the signal conductors 120 draw near zero power (i.e., less than 0.5 watts) to keep to the DC electronic solid-state switch 100 ON or OFF.

The DC electronic solid-state switch 102 includes a plurality of semiconductor dies 122 each disposed directly on the first electrically conductive trace 116 to facilitate the flow of electricity. Although the depicted embodiment shows eight semiconductor dies 122, the DC electronic solid-state switch 102 includes between four and sixteen semiconductor dies 122 (each with a voltage rating from 650 volts to 1200 volts) to electrically connected to one another in parallel to carry a 400A current and enhance scalability. Each of the plurality of semiconductor dies forms a metal-oxide-semiconductor filed-effect transistor (MOSFET) 123 and includes a source terminal S, a gate terminal G, and a drain terminal D. Each of the semiconductor dies 122 has a minimum area of twenty square millimeters to share and carry 400A current.

Figure 3:
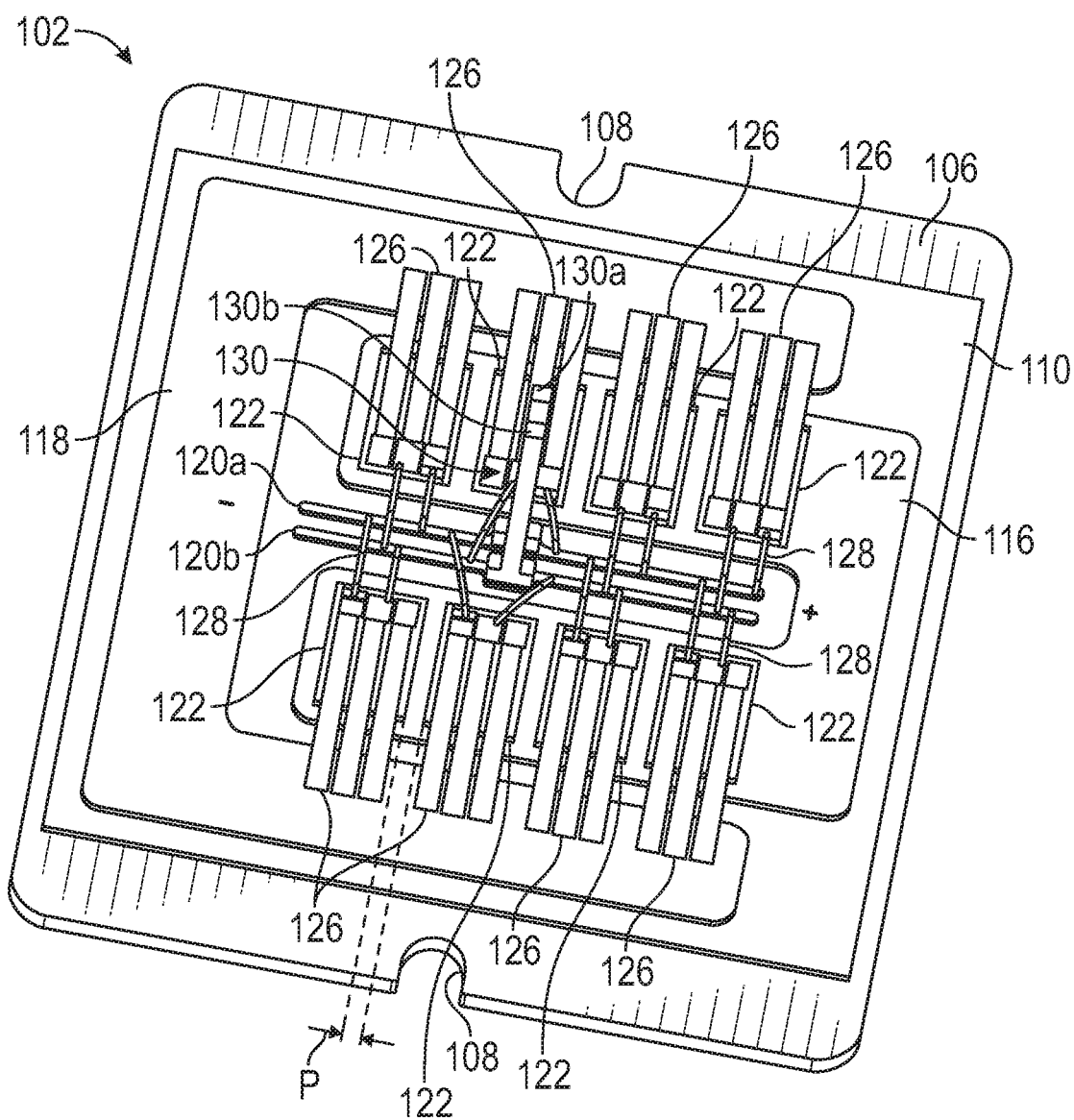
FIG. 3 is a schematic perspective view of a DC electronic solid-state switch of the switch assembly of FIG. 1.
Figure 4:
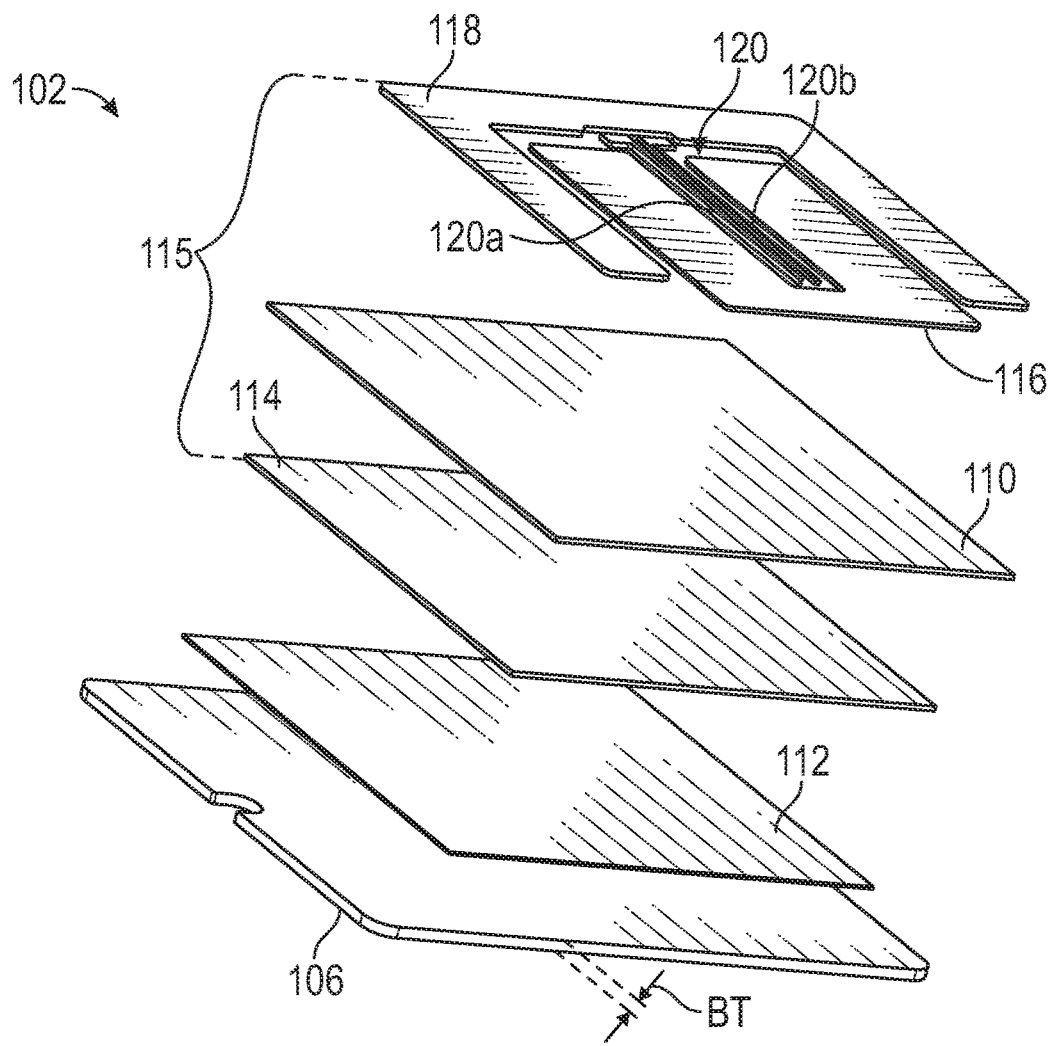
FIG. 4 is a schematic, exploded view of the DC electronic solid-state switch shown in FIG. 3.
Figure 5:
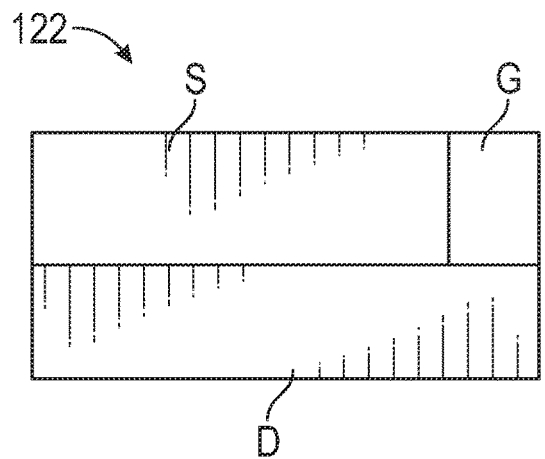
FIG. 5 is a schematic, front view of a semiconductor die of the DC electronic solid-state switch shown in FIG. 3.
Figure 6:
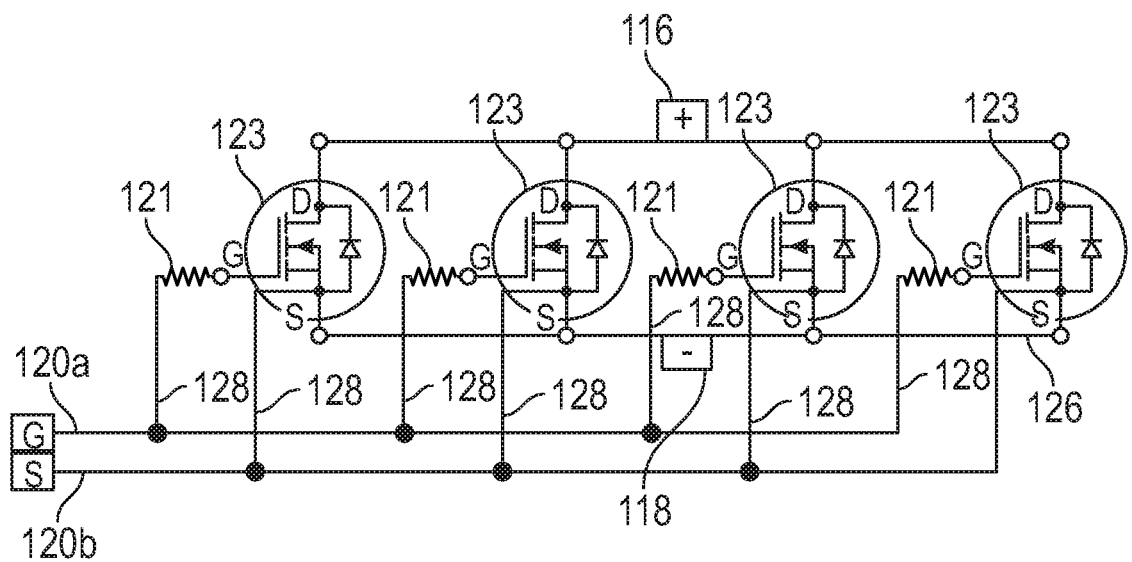
FIG. 6 is a schematic, electrical diagram of the DC electronic solid-state switch as shown in FIG. 3.

Each of the plurality of semiconductor dies 122 includes a semiconductor material, such as silicon, silicon carbide, gallium oxide, and gallium nitride. The semiconductor dies 122 are arranged in a predetermined pattern on top of the direct bonded substrate 115 (as shown in FIG. 3) to maintain substantially equal current and temperature distribution. The die spacing and terminal location is selected to maintain substantially equal current and temperature distribution between the semiconductor dies 122 (which are electrically connected in) and the minimize package size. In addition to the metallic sheet 114 and the electrically insulating and thermally conductive layer 110, the direct bonded substrate 115 includes the first electrically conductive trace 116, the second electrically conductive trace 118, and the signal conductors 120. The bottom side of each of the semiconductor dies 122 directly coupled to the first electrically conductive trace 116 (which has a predetermined shape). Each of the semiconductor dies 122 has a specific on-resistance that is less than 3.5 to 4.5 m-$\Omega$ $cm^2$. The placement of the semiconductor dies 122 and the pattern of the direct bonded substrate 115 achieve equal current distribution and low parasitic inductance. The DC electronic solid-state switch 102 includes a plurality of damping resistors 121 each electrically connected to the gate terminal of a respective MOSFET 123 in series to prevent or at least minimize power oscillations. The plurality of semiconductor dies 122 are electrically connected in parallel to achieve scalable current rating (e.g., multiple of 100 A), and the switch assembly 100 includes the electrically insulating and thermally conductive layer 110 (e.g., ceramic layer) with predetermined thermal stack height and pattern. For optimal thermal management, the spacing P between adjacent semiconductor dies 122 is greater than 1 millimeter and less than 3 millimeters. The term "spacing" means a distance between the edge of one of the semiconductors die 122 and the closest edge of the adjacent one of the semiconductors dies 122.

The semiconductor dies 122 may be capable of blocking between 650 V to 1200V (e.g., at least 1200V) DC, and the semiconductor dies 122 may have different stack lengths. As such, the DC electronic solid-state switch 102 is capable carrying a scalable current continuously in the on-state with a low on-state resistance. The switch assembly 100 includes a plurality of semiconductor dies 122 electrically connected to each other in parallel for scalability in a minimum package size with an isolation resistance that is greater than 50 Mohms and different stack lengths. The electrically insulating and thermally conductive layer 110 (e.g., ceramic layer) may have predetermined thermal stack heights and pattern to provide required thermal capabilities.

The DC electronic solid-state switch 102 includes a first plurality of electrical bonds 124 each electrically connected to a respective one of the plurality of semiconductor dies 122. Specifically, each of the first plurality of electrical bonds 126 electrically connects the source terminal of a respective MOSFET 123 to the second electrically conductive trace 118. Each of the first plurality of electrical bonds 126 electrically interconnects the plurality of semiconductor dies 122 and the second electrically conductive trace 118. Each of the first plurality of electrical bonds 126 may be a high current aluminum or copper ribbon bond or a foil bond to minimize parasitic inductance and resistance.

The DC electronic solid-state switch 102 further includes a second plurality of electrical bonds 128 each electrically connecting the plurality of signal conductors 120 to the plurality of semiconductor dies 122. Specifically, each of the second plurality of electrical bonds electrically connect either the gate terminal G or a source terminal of a respective MOSFET 123 to either the first signal conductor 120a or the second signal conductor 120b. The second plurality of electrical bonds may be short low-current wire bonds to minimize parasitic inductance and resistance.

The DC electronic solid-state switch 102 may include signal terminals 130 (e.g., a first signal terminal 130a and a second signal terminal 130b) electrically connected to the signal conductors 120. The first signal terminal 130a is directly coupled to the first signal conductor 120a and may be referred to as the gate terminal. The second signal terminal 130a is directly coupled to the second signal conductor 120a and may be referred to as the source terminal. The control inputs carried by the signal terminals 130 control the on/off state of the DC electronic solid-state switch 102. The signal terminals 130 are electrically isolate from the base plate 106.

Figure 2:
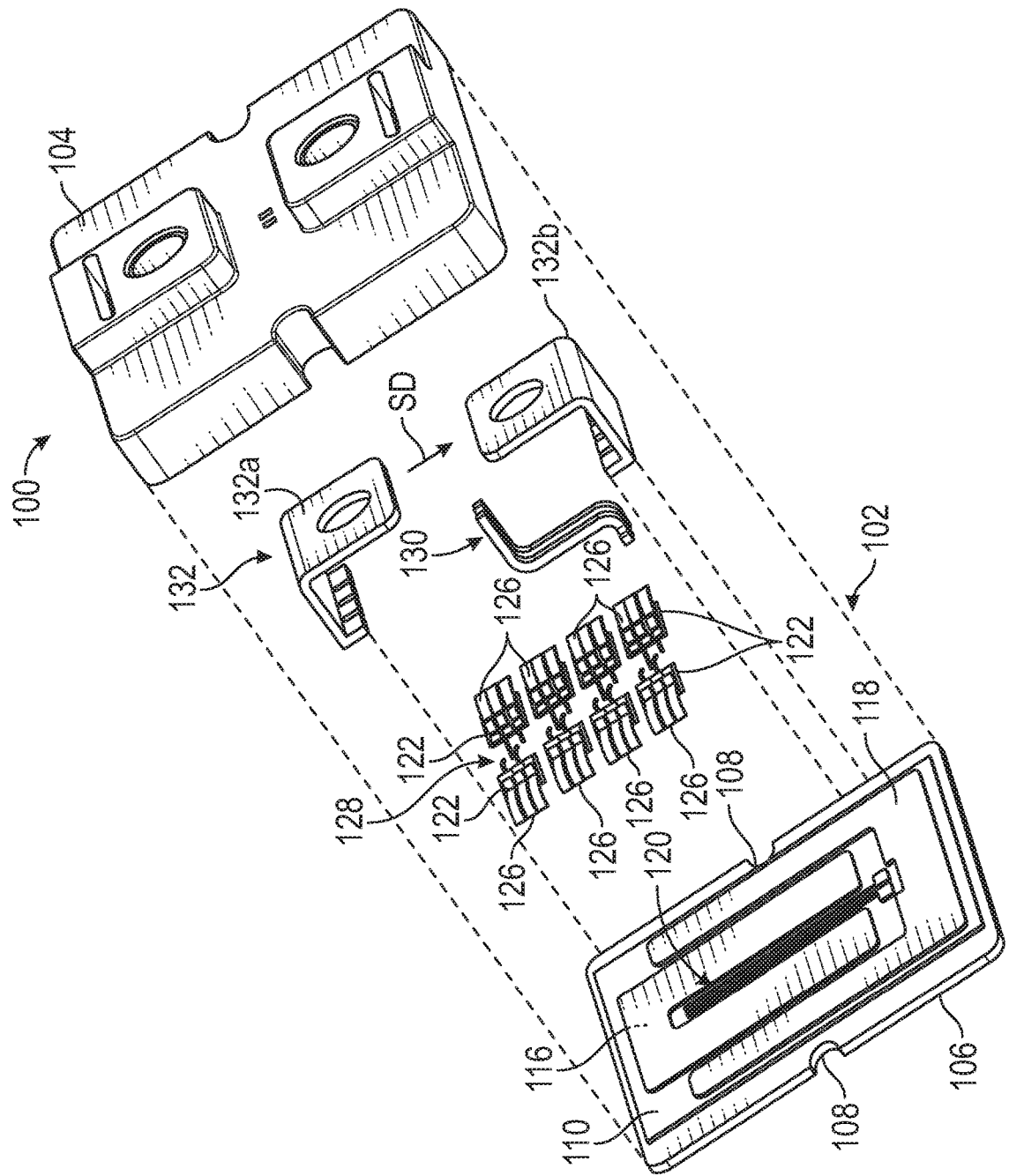
FIG. 2 is a schematic perspective, exploded view of the switch assembly of FIG. 1.

The DC electronic solid-state switch 102 may include a plurality of power terminal 132 (e.g., a first power terminal 132a and a second power terminal 132b as shown in FIG. 2). The first power terminal 132a is directly coupled to (and electrically connected to) the first electrically conductive trace 116. The second power terminal 132b is directly coupled to (and electrically connected to) the second electrically conductive trace 118. The power terminals 132 are electrically isolated from the base plate 106.

The DC electronic solid-state switch 102 may optionally include one or more thermistors 134 (shown in FIG. 7) directly connected to the direct bonded substrate 115 to measure (with optimal accuracy) the temperature of the DC electronic solid-state switch 102. The thermistors 134 may be directly coupled to the additional signal conductors 140a, 140b to measure and monitor the temperature of the DC electronic solid-state switch 102. One thermistor 134 may be directly coupled to the first signal conductor pair 140a, and another thermistor 134 is directly coupled to the second signal conductor 140b. Alternatively, the thermistors 134 may be embedded as a chip close to the bare semiconductor die 122.

Figure 7:
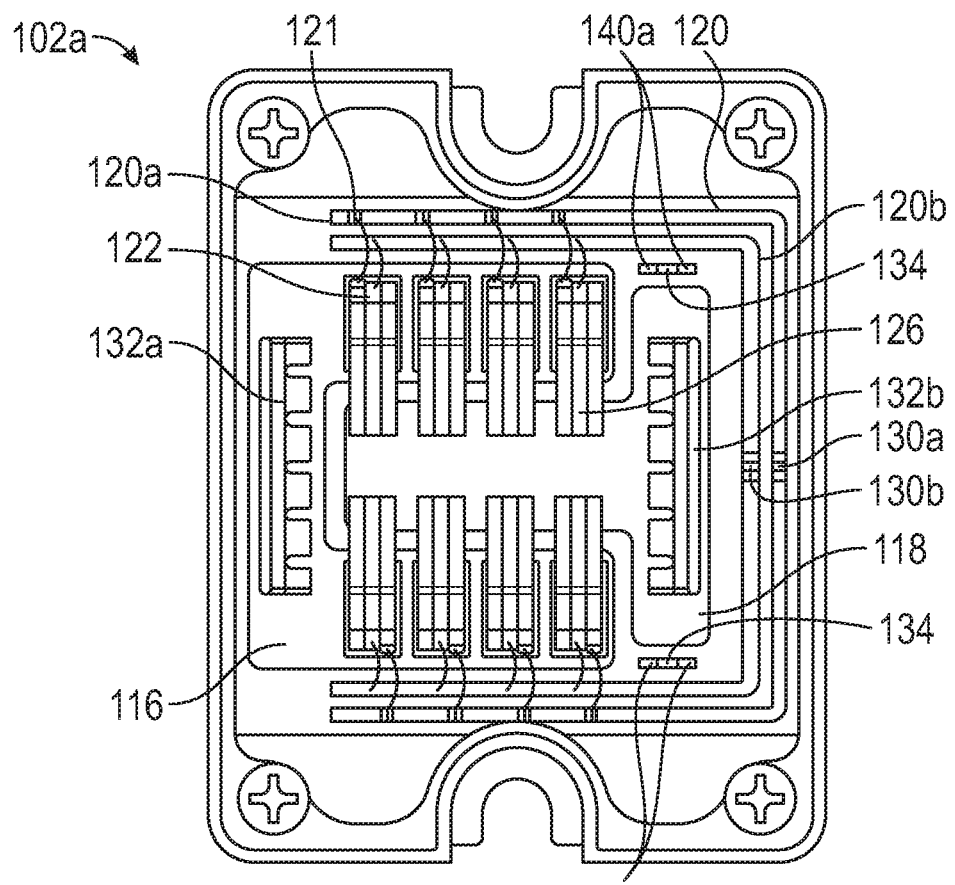
FIG. 7 is a schematic, top view of a DC electronic solid-state switch in accordance with another embodiment of the present disclosure.

With respect to FIG. 7, the structure and function of the DC electronic solid-state switch 102a is substantially identical to the DC electronic solid-state switch 102 described above, except for the features described below. In DC electronic solid-state switch 102a includes first electrically conductive trace 116 is substantially U-shaped and partially surrounds the second electrically conductive trace 118. The second electrically conductive trace 118 is T-shaped. The signal conductors 120 is substantially U-shaped and partially surround the first electrically conductive trace 116 and the second electrically conductive trace 118. This configuration facilitates manufacturing and enhances reliability. The signal conductor 120a has multiple top wire-bondable chip resistors 121 electrically attached on the lower side to the signal trace 120a. The upper side of the chip resistor 121 is wire bonded to the gate terminal of the closest semiconductor die 122. Use of top side wire-bondable chip resistors 121 saves space and minimizes parasitic inductance in the switch module and dampens high frequency oscillations during switching.

Figure 8:
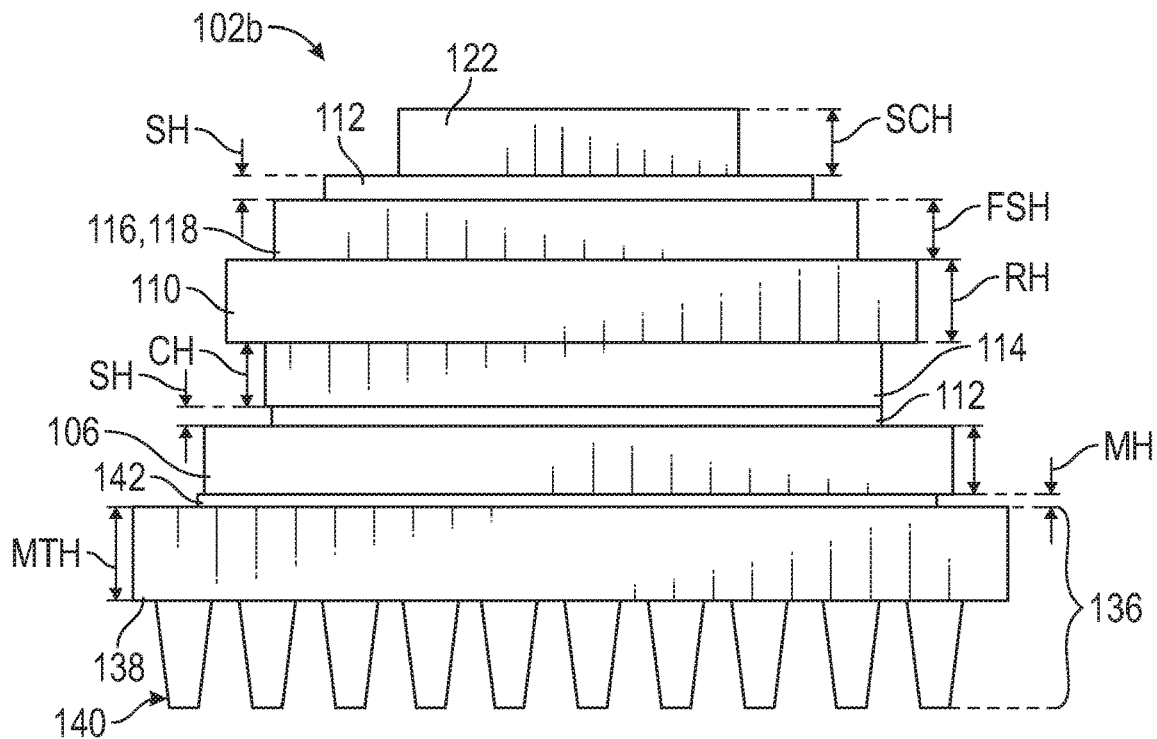
FIG. 8 is a schematic, side view of a DC electronic solid-state switch in accordance with another embodiment of the present disclosure.

With reference to FIG. 8, the structure and function of the DC electronic solid-state switch 102b is substantially identical to the DC electronic solid-state switch 102 described above, except for the features described below. The DC electronic solid-state switch 102b includes a heat sink 136 includes a heat-sink plate 138 and a plurality of pin fins 140 protruding directly from the bottom side of the heat-sink plate. The pin fins 140 may be wholly or partly made of aluminum. The maximum overall thickness MTH of the heat-sink plate 138 is between four millimeters and ten millimeters to enhance the thermal characteristics of the DC electronic solid-state switch 102b while minimizing its size.

The DC electronic solid-state switch 102b further includes a thermal interface material 142 disposed directly on top (and in direct contact with) an upper surface of the heat-sink plate 138 in order to maximize the heat transfer between the heat-sink plate 138 and the thermal interface material 142. The term "thermal interface material" means material that is inserted between two components in order to enhance the thermal coupling between them. Suitable thermal interface materials include, but are not limited to, thermal grease, thermal adhesive, thermal gap filler, thermal conductive pad, thermal tape, and phase-change materials, direct sinter or braze joint, among others. The maximum thickness MH of the thermal interface material 142 is less than 0.1 millimeters to enhance the thermal characteristics of the DC electronic solid-state switch 102b while minimizing its size.

The base plate 106 of the DC electronic solid-state switch 102b is disposed directly on (and in direct contact with) the thermal interface material 142 in order to maximize the heat transfer between base plate 106 and the thermal interface material 142. As discussed above, the base plate 106 may be wholly or partly made of a metallic material, such as copper, aluminum, and/or and alloys thereof and metal matrix composites. The maximum thickness BH of the base plate 106 is two millimeters to enhance the thermal characteristics of the DC electronic solid-state switch 102b while minimizing its size.

The solder layer 112 of the DC electronic solid-state switch 102b is disposed directly on (and in direct contact with) the base plate 106 to enhance the structural integrity of the DC electronic solid-state switch 102b. The maximum thickness SH of the solder layer 112 is at most 0.1 millimeters to enhance the thermal characteristics of the DC electronic solid-state switch 102b while minimizing its size.

The metallic sheet 114 of the DC electronic solid-state switch 102b is directly disposed on (and in direct contact with) the solder layer 112 to enhance the structural integrity of the DC electronic solid-state switch 102b. The maximum thickness CH of the metallic sheet 114 is at most 0.3 millimeters to enhance the thermal characteristics of the DC electronic solid-state switch 102b while minimizing its size. As discussed above, the metallic sheet 114 may be wholly or partly made of copper, aluminum, and/or an alloy thereof.

The electrically insulating and thermally conductive layer 110 (e.g., ceramic layer) of the DC electronic solid-state switch 102b is directly disposed on (and in direct contact with) the metallic sheet 114 to enhance the structural integrity of the DC electronic solid-state switch 102b. The maximum thickness RH of the electrically insulating and thermally conductive layer 110 is 0.0.1 to 0.4 millimeters to enhance the thermal characteristics of the DC electronic solid-state switch 102b while minimizing its size.

The first electrically conductive trace 116 and the second electrically conductive trace 118 of the DC electronic solid-state switch 102b are directly disposed on (and in direct contact with) the electrically insulating and thermally conductive layer 110 to enhance the structural integrity of the DC electronic solid-state switch 102b. The maximum thickness FSH of the first electrically conductive trace 116 and the second electrically conductive trace 118 is between 0.3 and 0.8 millimeters to enhance the electrical and thermal characteristics of the DC electronic solid-state switch 102b while minimizing its size.

Another solder layer 112 of the DC electronic solid-state switch 102b is directly disposed on (and in direct contact with) the first electrically conductive trace 116 and the second electrically conductive trace 118 to enhance the structural integrity of the DC electronic solid-state switch 102b. The maximum thickness of the solder layer 112 is at most 0.1 millimeters to enhance the thermal characteristics of the DC electronic solid-state switch 102b while minimizing its size.

The semiconductor dies 122 of the DC electronic solid-state switch 102b are directly disposed on (and in direct contact with) the solder layer 112 to enhance the structural integrity of the DC electronic solid-state switch 102b. The maximum thickness SCH of each semiconductor die 122 is 0.2 millimeters to enhance the thermal characteristics of the DC electronic solid-state switch 102b while minimizing its size.

Due to the dimensions, spacing, and materials of the components of the of the DC electronic solid-state switch 102b described above, the total thermal stack resistance Rth (without the heat sink 136) is less than one degree Celsius per Watt. The thermal stack and layout of the DC electronic solid-state switch 102b minimizes the current imbalance and reduces temperature rise through the heat conduction path or due to thermal cross talk between the semiconductor dies 122, assuming the worst-case cold plate is at 85 deg C. For minimum temperature rise, the thickness of the different components (as described above) should be used to minimize the temperature rise in DC electronic solid-state switch 102b. Also, the die-to-die spacing, die to edge spacing, and die to terminal spacing affect the temperature rise in the temperature rise in DC electronic solid-state switch 102b. In an exemplary case, the difference in temperature from the semiconductor dies 122 to the heat sink 136 may be preferably below 50 degrees Celsius. The power dissipated by each semiconductor die 122 may be preferably below 50 watts. The drain-source resistance RDs(on) of an exemplary semiconductor die 122 at its maximum temperature is 20 milliohms. The feasible current carried by each of such semiconductor die 122 is 50 amperes. For a 400A rating, eight such semiconductor dies 122 should be used and electrically connected in parallel.

Figure 9:
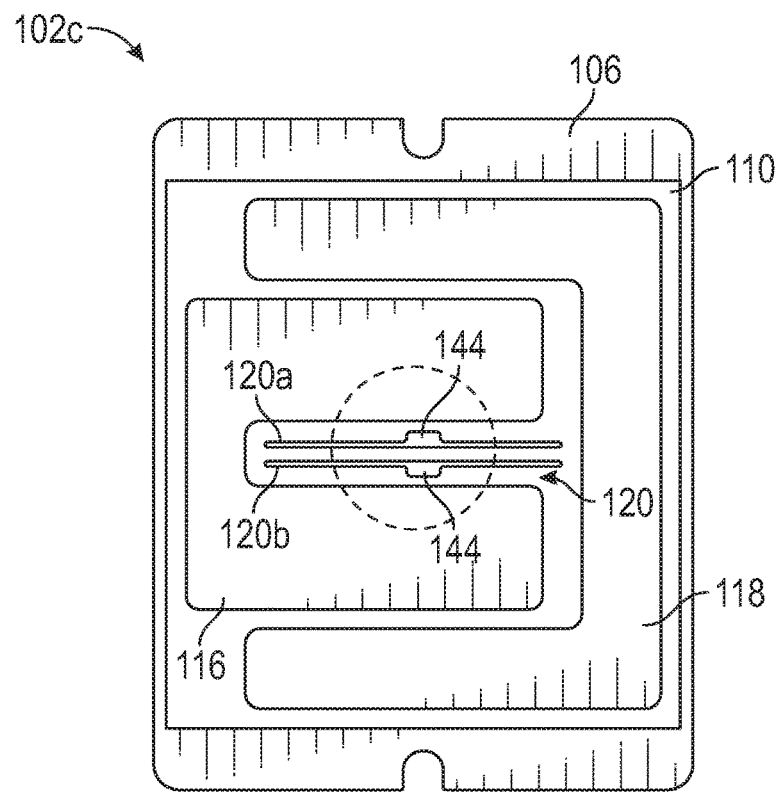
FIG. 9 is a schematic, side view of a DC electronic solid-state switch in accordance with another embodiment of the present disclosure.

With reference to FIG. 9, the structure and function of the DC electronic solid-state switch 102c is substantially identical to the DC electronic solid-state switch 102 described above, except for the features described below. In the DC electronic solid-state switch 102c, each of the signal conductors 120 (e.g., a first signal conductor 120a and a second signal conductor 120b includes pads 144 for soldering the pins for the external gate (G) and source (S) terminals of the DC electric solid-state switch 102.

The detailed description and the drawings or figures are supportive and descriptive of the present teachings, but the scope of the present teachings is defined solely by the claims. While some of the best modes and other embodiments for carrying out the present teachings have been described in detail, various alternative designs and embodiments exist for practicing the present teachings defined in the appended claims.

What is claimed is:

1. A switch assembly, comprising:
   a case;
   a direct current (DC) electronic solid-state switch coupled to the case, wherein the case covers the DC electronic solid-state switch, and the DC electronic solid-state switch has an on-state and off-state, and the DC electronic solid-state switch includes:
      a base plate;
      an electrically insulating and thermally conductive layer disposed on the base plate;
      a first electrically conductive trace disposed on the electrically insulating and thermally conductive layer, wherein the first electrically conductive trace forms a positive terminal;
      a second electrically conductive trace disposed on the electrically insulating and thermally conductive layer, wherein the second electrically conductive trace forms a negative terminal;
      a plurality of semiconductor dies each disposed on the first electrically conductive trace, wherein each of the plurality of semiconductor dies forms a MOSFET;
      a first plurality of electrical bonds each electrically connected to a respective one of the plurality of semiconductor dies, wherein each of the first plurality of electrical bonds electrically interconnects the plurality of semiconductor dies and the second electrically conductive trace;
      a plurality of signal conductors disposed on the electrically insulating and thermally conductive layer;
      a second plurality of electrical bonds that are electrically connecting the plurality of signal conductors to the plurality of semiconductor dies; and
   wherein the DC electronic solid-state switch blocks at least between 650 volts and 1200 volts in a single direction in an off-state, and the DC electronic solid-state switch continuously carries at least 400 amperes direct current with a voltage drop of less than one volt in an on-state.

2. The switch assembly of claim 1, wherein the base plate has a thickness between two millimeters and three millimeters, and the plurality of semiconductor dies are electrically connected to one another in parallel.

3. The switch assembly of claim 2, further comprising a solder layer disposed between the base plate and the electrically insulating and thermally conductive layer to connect the base plate to the electrically insulating and thermally conductive layer, wherein the case includes a polymeric material, the electrically insulating and thermally conductive layer includes a ceramic material, and the base plate includes copper, the solder layer is directly coupled to the base plate, and each of the base plate, the electrically insulating and thermally conductive layer, and the solder layer has a planar shape.

4. The switch assembly of claim 3, wherein each of the first electrically conductive trace and the second electrically conductive trace is directly coupled to the electrically insulating and thermally conductive layer, each of the first electrically conductive trace and the second electrically conductive trace is directly bonded to the electrically insulating and thermally conductive layer, each of the plurality of signal conductors is directly coupled to the electrically insulating and thermally conductive layer, and each of the plurality of signal conductors is directly bonded to the electrically insulating and thermally conductive layer, each of the plurality of signal conductors, the first electrically conductive trace, and the second electrically conductive trace includes a metallic material, the metallic material is selected from a group consisting of copper, aluminum and alloys thereof.

5. The switch assembly of claim 4, wherein each of the plurality of semiconductor dies has a minimum area of twenty square millimeters, each of the plurality of semiconductor dies includes a semiconductor material, the semiconductor material is selected from a group consisting of silicon, silicon carbide, gallium oxide, and gallium nitride, the plurality of semiconductor dies includes between four and sixteen semiconductor dies to connected in parallel to carry a 400A current, each of the plurality of first electrical bonds is at least one of a ribbon bond or a wire bond, and each of the second plurality of electrical bonds is a wire bond.

6. The switch assembly of claim 5, wherein each of the first electrically conductive trace and the second electrically conductive trace is directly coupled to the electrically insulating and thermally conductive layer, and the plurality of semiconductor dies includes between four and sixteen semiconductors dies, and a specific on-resistance of each of the plurality of semiconductor dies is less than 3.5 to 4.5 mΩ-cm$^2$.

7. The switch assembly of claim 6, wherein the switch assembly has a maximum width of 55 to 65 millimeters, a maximum length of 65 millimeters, and a maximum height of 25 millimeters.

8. The switch assembly of claim 7, wherein a mass of the switch assembly is equal to or less than 250 grams.

9. The switch assembly of claim 8, further comprising a plurality of thermistors coupled to the signal conductors.

10. The switch assembly of claim 9, wherein an isolation resistance of the switch assembly is greater than 50 megaohms.

11. The switch assembly of claim 10, wherein the DC electronic solid-state switch has a mass that is equal to or less than 250 grams and a switching on/off times is less than 10 microseconds.

12. The switch assembly of claim 11, further comprising a metallic sheet, wherein the electrically insulating and thermally conductive layer is directly bonded on the metallic sheet, the metallic sheet and the electrically insulating and thermally conductive layer collectively form direct bonded substrate, and the metallic sheet includes a metal selected from a group consisting of copper and aluminum.

13. The switch assembly of claim 1, wherein the DC electronic solid-state switch is capable carrying a scalable current continuously in the on-state with a low on-state resistance, and the semiconductor dies are capable of blocking at least between 650V and 1200V direct current.

14. The switch assembly of claim 1, wherein a spacing between adjacent one of the plurality of semiconductor dies is greater than one millimeter and less than three millimeters.

15. The switch assembly of claim 1, further comprising a heat sink directly coupled to the base plate, wherein the heat sink includes a heat-sink plate and a plurality of pin fins protruding from the heat-sink plate, the base plate has a maximum thickness between two millimeters and three millimeters, a maximum thickness of the heat-sink plate is four millimeters.

16. The switch assembly of claim 15, further comprising a thermal interface material disposed between the heat-sink plate and the base plate, wherein a maximum thickness of the thermal interface material is 0.1 millimeters, and a maximum thickness of the base plate is 2 millimeters.

17. The switch assembly of claim 16, further comprising a metallic sheet, wherein the electrically insulating and thermally conductive layer is directly bonded on the metallic sheet, a maximum thickness of metallic sheet is 0.3 millimeters, a maximum thickness of the electrically insulating and thermally conductive layer is between 0.1 millimeters and 0.4 millimeters, a maximum thickness of each of the first electrically conductive trace and the second electrically conductive trace is between 0.3 millimeters and 0.8 millimeters, and a maximum thickness of each of the semiconductor dies is 0.2 millimeters.

18. A direct current (DC) electronic solid-state switch, comprising:
  a base plate;
  an electrically insulating and thermally conductive layer disposed on the base plate;
  a first electrically conductive trace disposed on the electrically insulating and thermally conductive layer, wherein the first electrically conductive trace forms a positive terminal;
  a second electrically conductive trace disposed on the electrically insulating and thermally conductive layer, wherein the second electrically conductive trace forms a negative terminal;
  a plurality of semiconductor dies each disposed on the first electrically conductive trace, wherein each of the plurality of semiconductor dies forms a MOSFET;
  a first plurality of electrical bonds each electrically connected to a respective one of the plurality of semiconductor dies, wherein each of the first plurality of electrical bonds electrically interconnects the plurality of semiconductor dies and the second electrically conductive trace;
  a plurality of signal conductors disposed on the electrically insulating and thermally conductive layer; and a second plurality of electrical bonds that are electrically connecting the plurality of signal conductors to the plurality of semiconductor dies.

19. The DC electronic solid-state switch of claim 18, wherein the base plate has a thickness between two millimeters and three millimeters, and the plurality of semiconductor dies are electrically connected to one another in parallel.

20. The DC electronic solid-state switch of claim 19, further comprising a solder layer disposed between the base plate and the electrically insulating and thermally conductive layer to connect the base plate to the electrically insulating and thermally conductive layer, wherein the electrically insulating and thermally conductive layer includes a ceramic material, and the base plate includes copper, the solder layer is directly coupled to the base plate, and each of the base plate, the electrically insulating and thermally conductive layer, and the solder layer has a planar shape.

* * * * *